(12) United States Patent
Vansickle et al.

(10) Patent No.: US 9,595,402 B2
(45) Date of Patent: Mar. 14, 2017

(54) SINGLE KNOB CONTROLLER

(71) Applicants: Larry Vansickle, Phoenix, AZ (US);
Wang Hai, Ningbo (CN); Gu Wen Dong, Ningbo (CN)

(72) Inventors: Larry Vansickle, Phoenix, AZ (US);
Wang Hai, Ningbo (CN); Gu Wen Dong, Ningbo (CN)

( * ) Notice: Subject to any disclaimer, the term of this patent is extended or adjusted under 35 U.S.C. 154(b) by 0 days.

(21) Appl. No.: 14/800,705

(22) Filed: Jul. 16, 2015

(65) Prior Publication Data

US 2016/0021456 A1   Jan. 21, 2016

Related U.S. Application Data

(60) Provisional application No. 62/025,646, filed on Jul. 17, 2014.

(51) Int. Cl.
| | |
|---|---|
| *H04R 3/00* | (2006.01) |
| *H01H 3/08* | (2006.01) |
| *H03G 3/02* | (2006.01) |
| *H01H 25/06* | (2006.01) |
| *H01H 9/16* | (2006.01) |

(52) U.S. Cl.
CPC .............. *H01H 3/08* (2013.01); *H01H 25/06* (2013.01); *H03G 3/02* (2013.01); *H01H 9/161* (2013.01); *H01H 2003/085* (2013.01)

(58) Field of Classification Search
CPC ..................................................... H03G 3/02
See application file for complete search history.

(56) References Cited

U.S. PATENT DOCUMENTS

| | | | | |
|---|---|---|---|---|
| 4,131,033 A * | 12/1978 | Wright | ..................... | G05G 1/02 200/316 |
| 5,665,946 A * | 9/1997 | Nishijima | .............. | H01H 25/06 200/18 |
| 5,959,267 A * | 9/1999 | Kawasaki | ................ | H01H 3/10 200/11 R |
| 6,130,386 A * | 10/2000 | Jorczak | .................. | H01H 9/161 200/17 R |
| 6,154,201 A * | 11/2000 | Levin | ..................... | G05G 9/047 345/156 |
| 6,556,005 B1 * | 4/2003 | Oomkes | ................. | G01D 5/145 324/207.2 |
| 6,660,947 B1 * | 12/2003 | Badescu | ................ | H01H 25/06 200/4 |
| 6,867,379 B2 * | 3/2005 | Hayashi | .................. | G05G 1/08 200/4 |
| 8,084,703 B2 * | 12/2011 | Hisamune | .............. | H01H 19/14 200/336 |

(Continued)

*Primary Examiner* — Brenda Bernardi
(74) *Attorney, Agent, or Firm* — Keith L. Jenkins, Fegistered Patent Attorney. LLC; Keith L. Jenkins

(57) ABSTRACT

A single knob for controlling at least an audio input signal to produce up to fourteen distinct results, plus one quiescent state, through axial translational states corresponding to: the knob being translationally biased out, pushed in, or pushed in and held; and rotational states corresponding to: rotationally biased to a first position, turned clockwise, turned clockwise and held, turned counterclockwise, and turned clockwise and held, and combinations of those translational and rotational states. The single knob controller can be linked to a Bluetooth device for controlling such device. Some applications include automotive electronics and audio systems generally.

20 Claims, 6 Drawing Sheets

(56) References Cited

U.S. PATENT DOCUMENTS

| | | | | |
|---|---|---|---|---|
| 8,217,742 B2 * | 7/2012 | Trudeau | ................. | G01D 5/145 |
| | | | | 200/4 |
| 2007/0187215 A1 * | 8/2007 | Lavigne | .................. | H01H 3/20 |
| | | | | 200/4 |
| 2007/0188024 A1 * | 8/2007 | Shitanaka | ............... | G09F 13/04 |
| | | | | 307/10.1 |
| 2008/0023313 A1 * | 1/2008 | Sack | ...................... | B60K 37/06 |
| | | | | 200/400 |
| 2015/0303009 A1 * | 10/2015 | Seo | ....................... | H01H 19/04 |
| | | | | 200/4 |

* cited by examiner

SINGLE KNOB CONTROLLER

CROSS REFERENCE TO RELATED APPLICATIONS

This application claims the benefit of U.S. provisional patent application 62/025,646 filed 17 Jul. 2014 to the same inventors.

FIELD OF ART

The present invention relates to electronic controls for Bluetooth and similar devices. In particular, the present invention relates to a controller in which all the control functions can be performed with a single knob.

STATEMENT REGARDING FEDERALLY SPONSORED RESEARCH AND DEVELOPMENT

None.

SUMMARY OF THE INVENTION

A controller for Bluetooth devices that can perform the functions of answering a call, hanging up a call, activating Siri or Google voice command, changing track up or down, turning volume up or down, and pairing Bluetooth devices, all with a single manually controllable knob.

DESCRIPTION OF THE FIGURES OF THE DRAWINGS

The present invention will hereinafter be described in conjunction with the following drawing figures, wherein like numerals denote like elements.

DETAILED DESCRIPTION OF THE INVENTION

Figure 1:
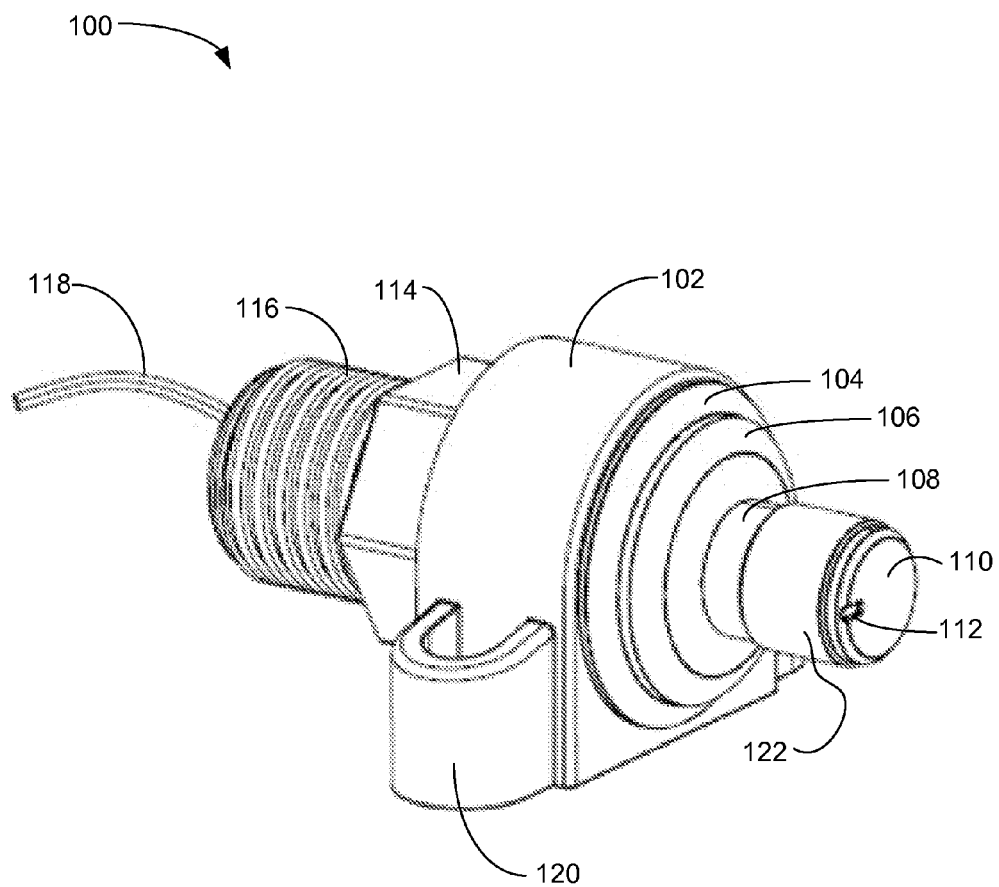
FIG. 1 is a front-side perspective view illustrating an exemplary embodiment of the single knob controller, according to a preferred embodiment of the present invention.

FIG. 1 is a front-side perspective view illustrating an exemplary embodiment of the single knob controller 100, according to a preferred embodiment of the present invention. Single knob controller 100 includes outer housing 102, threaded electronics housing 116 with annular flange 106, annular support flange 104, knob 110, nut 114, and power conduits 118. Outer housing 102 has two fastener receivers 120 (one visible in this view) for receiving fasteners for securing the housing 102 to a panel 502 (see FIG. 5). Various fastener receivers 120 that meet the functional requirements are within the scope of the invention. Housing 102 is preferably made of a translucent material that is preferably plastic. However, other materials that are rigid, durable, and translucent may be used in various other embodiments.

Annular support flange 104 is non-rotationally coupled to outer housing 102 and supports the annular flange 106 and body of the threaded electronics housing 116. Annular support flange 104 is preferably made of a translucent material that is preferably plastic. However, other materials that are rigid, durable, and translucent may be used in various other embodiments. Additional details about the annular support flange 104 will be provided below.

Annular flange 106 of threaded electronics housing 116 is supported by the annular support flange 104. Threaded electronics housing 116 extends rearward from rear surface of annular flange 106, through the annular support flange 104, through the outer housing 102, and through nut 114. Nut 114 has internal threads, but the annular support flange 104 and the annular flange 106 do not. In various other embodiments, either or both of the annular support flange 104 and the annular flange 106 may have internal threads. Threaded electronics housing 116 houses the circuitry that operates the single knob controller 100.

Knob 110 has a rotational position indicator 112, a thin shaft 108, and a wider portion 122 forward of the shaft 108. Knob 110 operates as both a push button and as a knob that can be rotated clockwise and counterclockwise. In pushbutton mode, inward travel is limited to the length of the thin shaft 108. At that limit, the wider portion 122 abuts annular flange 106 and prevents further inward travel. The knob 110 is biased into the outward position and into one rotational position. In another embodiment, knob 110 may not be biased into one rotational position.

Power conduits 118 preferably include a positive direct current twelve volt conduit and a conduit to ground. In other embodiments, other voltages may be used, as may be customary in different countries.

Figure 2:
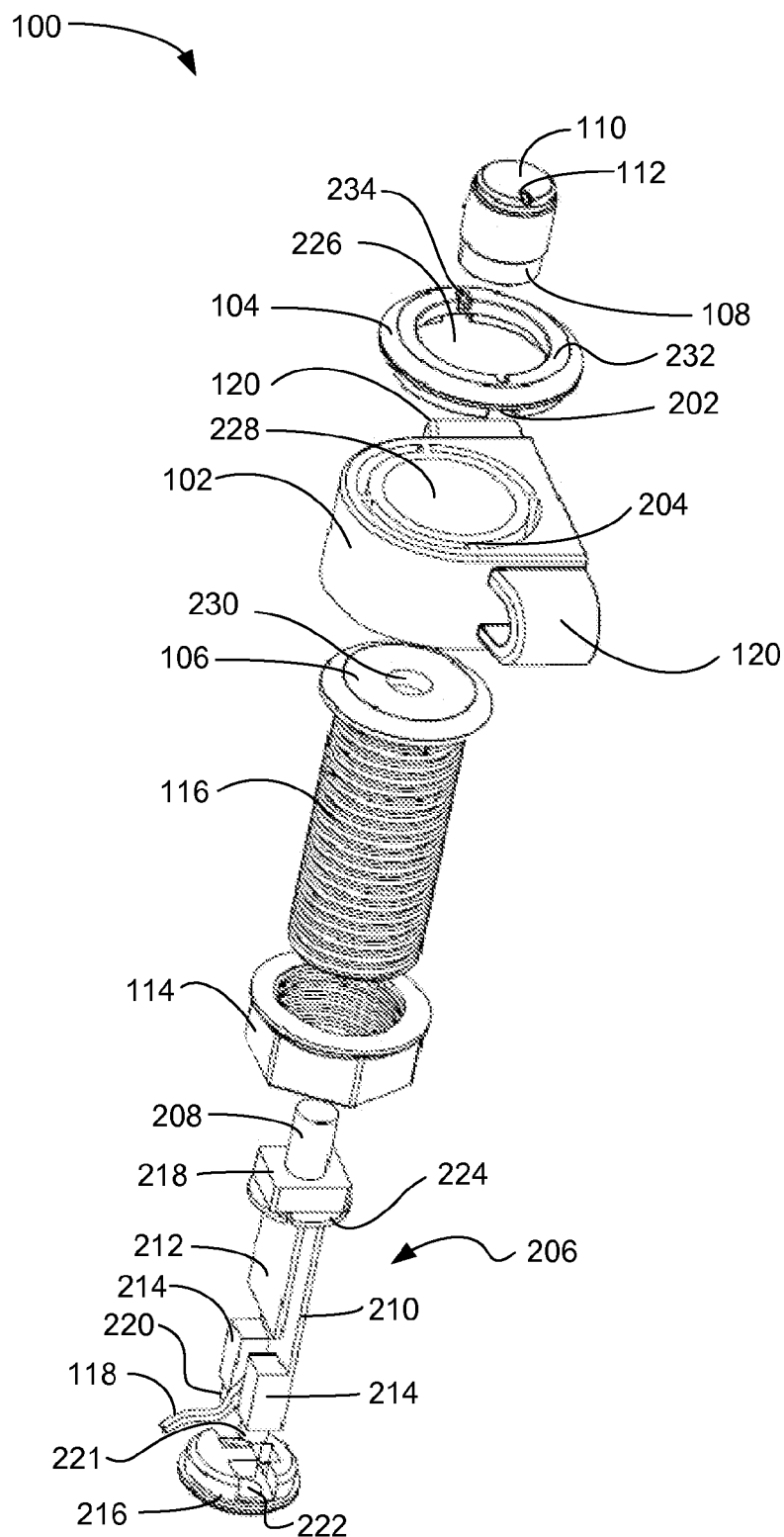
FIG. 2 is a exploded perspective view illustrating the exemplary embodiment of the single knob controller of FIG. 1, according to a preferred embodiment of the present invention.

FIG. 2 two is an exploded perspective view illustrating the exemplary embodiment of the single knob controller 100 of FIG. 1, according to a preferred embodiment of the present invention. FIG. 2 is not shown in assembly order, as threaded electronics housing 116 would be between the annular support flange 104 and knob 110 in an assembly-ordered view. The annular support flange 104 is shown to have an opening 226 having a diameter to slidingly receive threaded electronics housing 116. The annular support flange 104 also has a flat annular surface 232 which supports in abutment the underside of annular flange 106. Notches 202 (two of four shown in this view, one labeled) in the annular support flange 104 correspond to keys 204 (one of four labeled) in outer housing 102 to secure the annular support flange 104 from rotation relative to the outer housing 102. Upper notches 234 (one of two labeled) accept keys on the underside of annular flange 106 (not shown) to prevent rotation of the threaded electronics housing 116.

Outer housing 102 has an opening 228 having an inside diameter that slidingly received the threaded electronics housing 116. Nut 114 is threaded onto threaded electronics housing 116 to tighten against a rear surface of the outer housing 102 to clamp the annular support flange 104, the annular flange 106, the outer housing 102, and the threaded electronics housing 116 together.

Annular flange 106 of threaded electronics housing 116 has a central opening 230 which slidingly receives actuator 208, which extends beyond annular flange 106 to receive knob 110. The electronics package 206 includes a small elongated printed circuit board (PCB) 210 that is sized to fit within the threaded electronics housing 116. Rigidly mounted at right angles to the elongated PCB 210 is a small generally circular PCB 224 which supports the actuator 208 via its base and transducers 218 on the forward side and a cantilevered PCB 212 on its rearward side. The diameter of circular PCB is sized to snugly slidingly fit within the threaded electronics housing 116. Elongated PCB 210 also supports audio input jack 220 and audio output jack 221. Each jack 220 and 221 has associated a physical support 214 and may have signal conditioning circuitry therein. Power conduits 118 have been discussed above. End piece 216 can be fixed to close the end of the threaded electronics housing 116. End piece 216 has two openings 222 (one labeled) through which jacks 220 and 221 extend after final assembly and another opening through which power conduits 118 extend after final assembly.

The preferred assembly sequence is as follows: first, the annular support flange 104 is inserted into the outer housing 102 with keys 204 aligned to notches 202. Second, the threaded electronics housing 116 is inserted through opening 226 and opening 228 with keys (not shown) beneath the annular flange 106 aligning with upper notches 234, so that the underside surface of annular flange 106 abuts annular surface 232 of the annular support flange 104. Third nut 114 is tightened to secure the annular support flange 104, the annular flange 106, outer housing 102, and the threaded electronics housing 116 together. Fourth, the electronics package 206 is inserted into the threaded electronics housing 116 such that actuator 208 extends through opening 230 to receive knob 110 which may be attached to actuator 208 adhesively or by other known means. Fifth, the power conduits 118 are threaded through an opening in end piece 216 and end piece 216 is aligned such that jacks 220 and 221 pass through openings 222 and then end piece 216 is attached to threaded electronics housing 116. In a particular embodiment, sealing material may be used to make a water resistant single knob controller 100.

Figure 3:
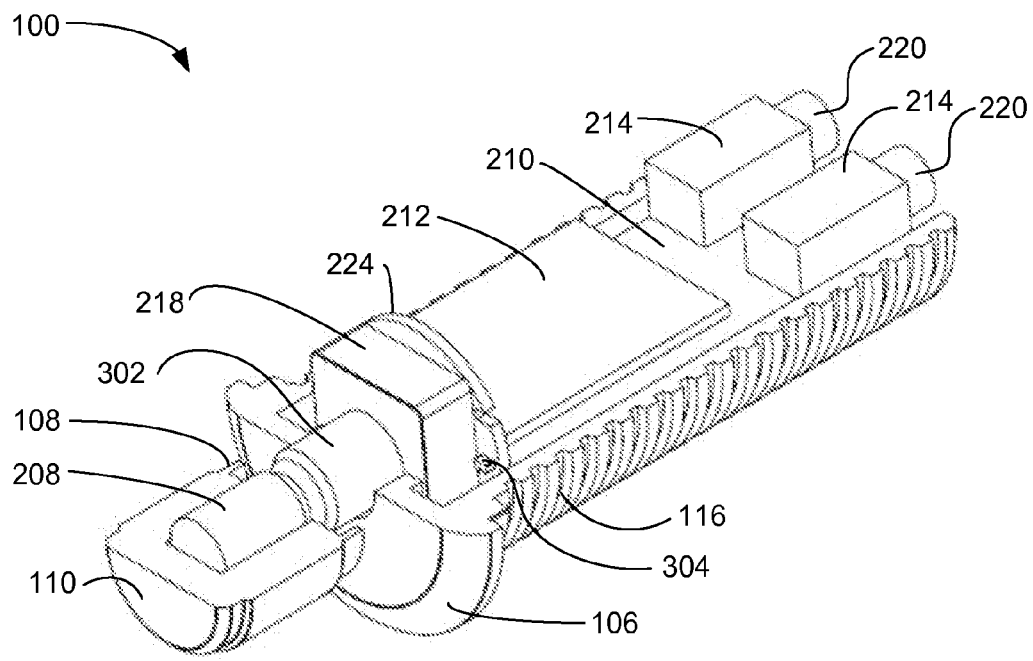
FIG. 3 is a front side perspective cutaway view illustrating a portion of the exemplary embodiment of the single knob controller of FIG. 1, according to a preferred embodiment of the present invention.

FIG. 3 is a front side perspective cutaway view illustrating a portion of the exemplary embodiment of the single knob controller 100 of FIG. 1, according to a preferred embodiment of the present invention. Shown in greater detail here, the chamber 302 may hold the biasing device, such as a spring, for biasing knob 110 linearly and rotationally. Circular PCB supports light emitting diode (LED) 304, which is selected in coordination with the color and translucency of the outer housing 102, annular support flange 104, and the annular flange 106 to be seen through the housing 102, annular support flange 104, and the annular flange 106 when activated.

Figure 4:
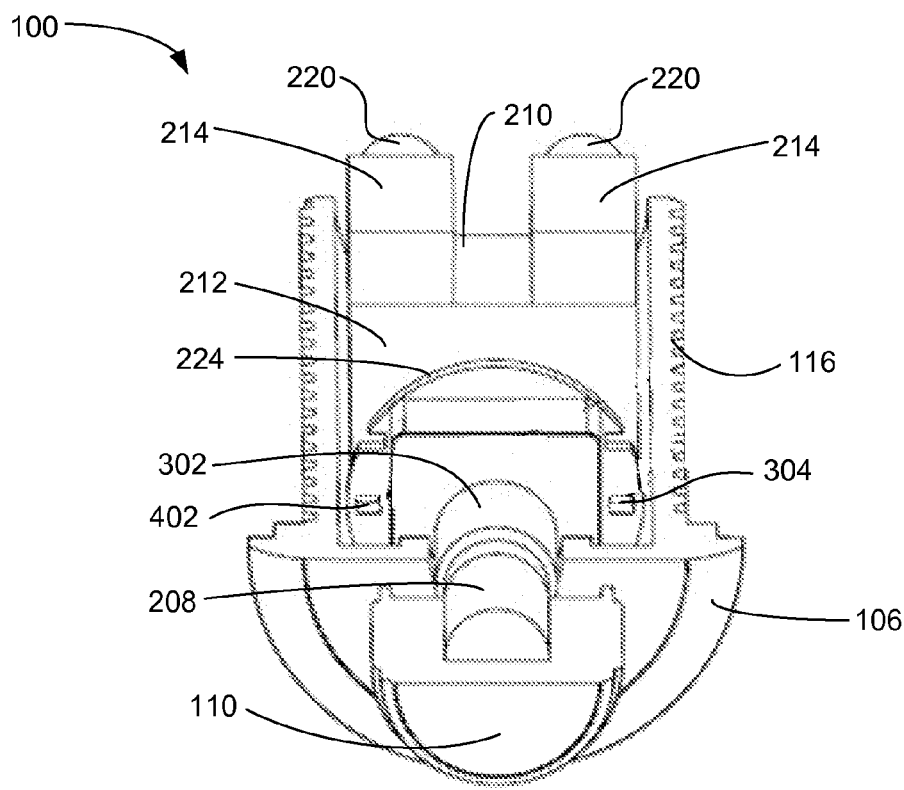
FIG. 4 is a front top perspective cutaway view illustrating a portion of the exemplary embodiment of the single knob controller of FIG. 1, according to a preferred embodiment of the present invention.

FIG. 4 is a front top perspective cutaway view illustrating a portion of the exemplary embodiment of the single knob controller 100 of FIG. 1, according to a preferred embodiment of the present invention. A second LED 402 is shown mounted on circular PCB 224. The LEDs 304 and 402 are used to communicate, among other things, that an attempt to pair a Bluetooth device to the single knob controller 100 has not yet completed. For example, the LEDs 304 and 402 may flash while waiting for the pairing process to complete and then stop flashing when pairing is complete. LEDs 304 and 402 may be of the same or different colors.

Figure 5:
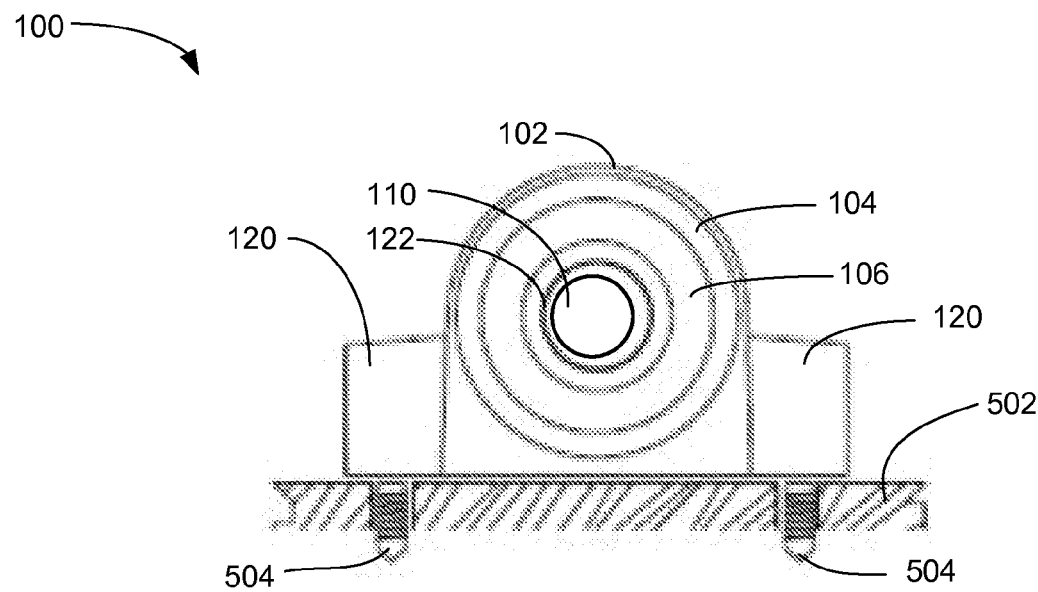
FIG. 5 is a front elevation view illustrating the exemplary embodiment of the single knob controller of FIG. 1, according to a preferred embodiment of the present invention.

FIG. 5 is a front elevation view illustrating the exemplary embodiment of the single knob controller 100 of FIG. 1, according to a preferred embodiment of the present invention. Screws 504 inserted through fastener receivers 120 fasten the single knob controller 100 on the surface of a panel 502. While the panel 502 is shown as horizontal, that is not a limitation of the invention. Likewise, the illustrated type of fastener is not a limitation of the invention.

Figure 6:
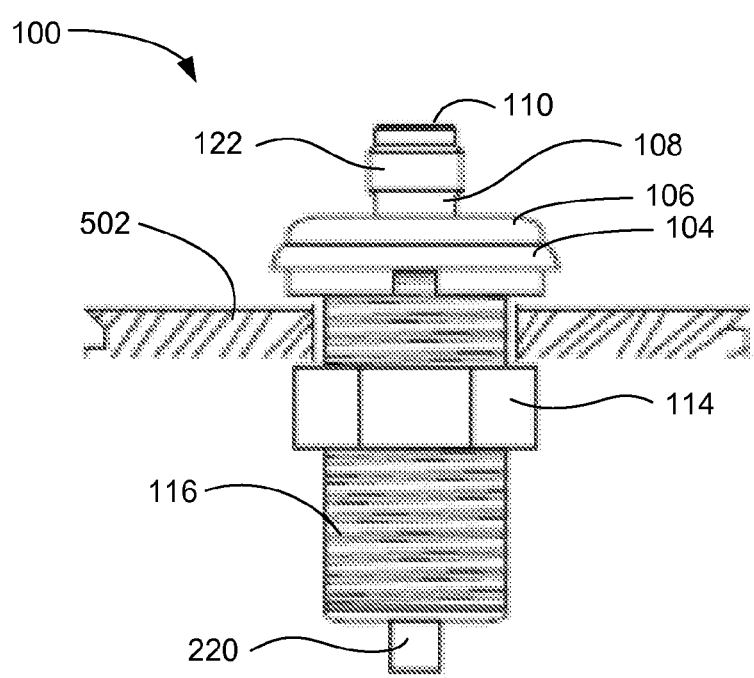
FIG. 6 is a side elevation view illustrating an exemplary installation of the exemplary embodiment of the single knob controller of FIG. 1, according to a preferred embodiment of the present invention.

FIG. 6 is a side elevation view illustrating an exemplary installation of the exemplary embodiment of the single knob controller 100 of FIG. 1, according to a preferred embodiment of the present invention. To install the single knob controller 100 in a panel 500, the outer housing 102 may be omitted, as shown, and the nut 114 may be used to tighten the annular support flange 104 to the panel 502.

Figure 7:
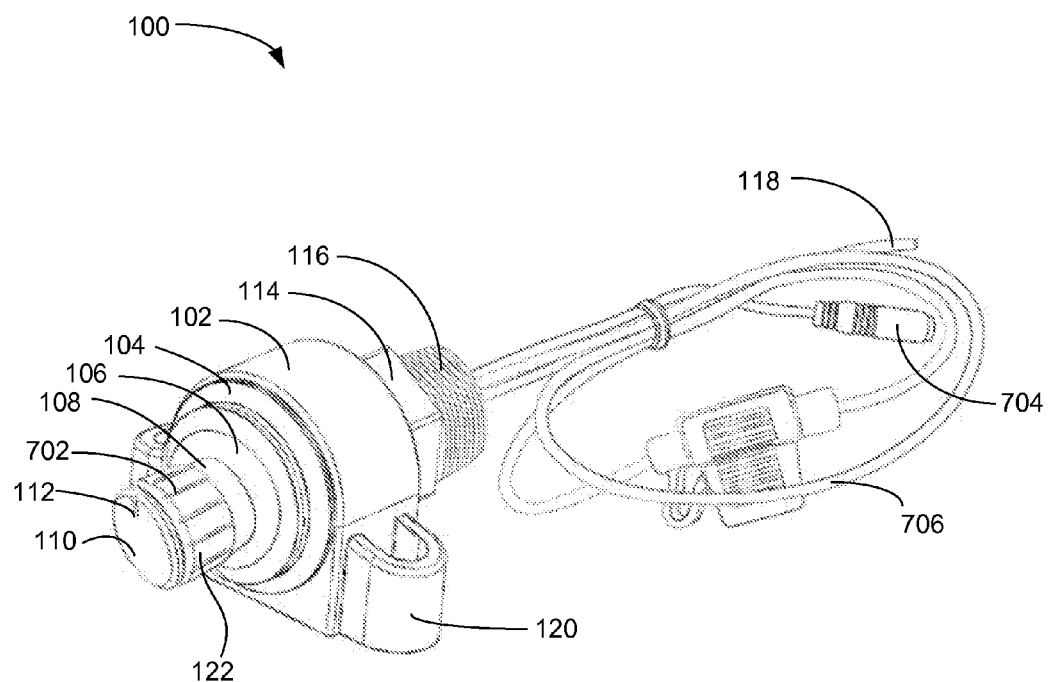
FIG. 7 is a perspective view illustrating the exemplary embodiment of the single knob controller of FIG. 1, according to a preferred embodiment of the present invention.

FIG. 7 is a perspective view illustrating the exemplary embodiment of the single knob controller 100 of FIG. 1, according to a preferred embodiment of the present invention. Knob 110 may be provided with tactile assistive features 702, illustrated here as grooves. Any known tactile assistive feature may be used in various embodiments. There are four conductors coupled to the electronics package 206. Two power conduits 118, an input audio wire 704 and an output audio wire 706 are connected to the electronics package 206.

Figure 8:
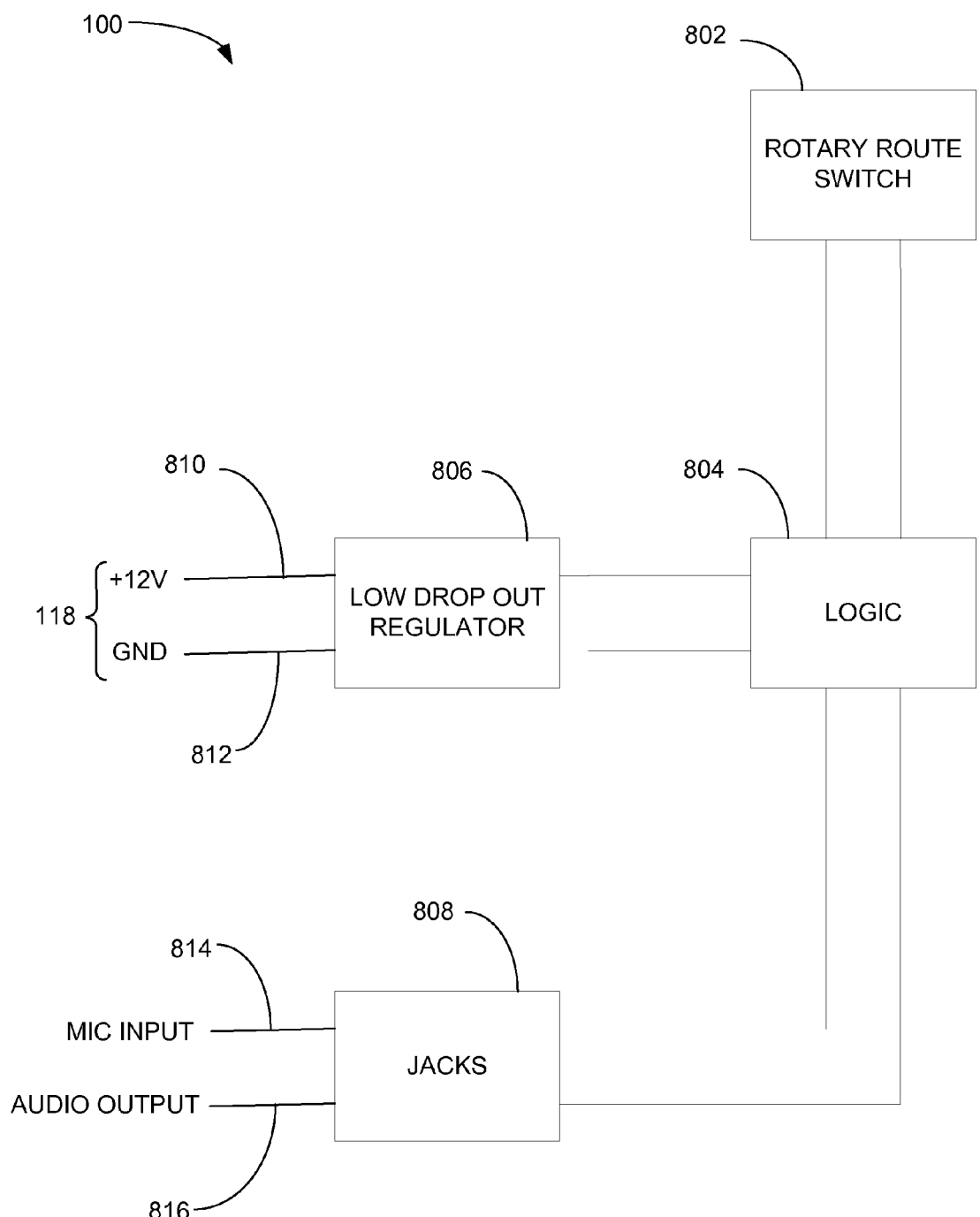
FIG. 8 is a diagrammatic view illustrating the exemplary embodiment of the single knob controller of FIG. 1, according to a preferred embodiment of the present invention.

FIG. 8 is a diagrammatic view illustrating the exemplary embodiment of the single knob controller 100 of FIG. 1, according to a preferred embodiment of the present invention. Twelve volt DC power from a battery, automobile electrical system, or other power supply, in the form of a positive twelve volt line 810 and a ground line 812 (collectively power conduits 118) feeds a low drop out regulator 806 that supplies regulated power to the logic 804, transducers, and other circuits in electronics package 206. Logic 804 receives inputs from the rotary route switch 802, implemented in hardware as actuator 208 and transducers 218, and manipulates incoming audio 814 signals to produce audio output 816 through jacks 808 (implemented in hardware as jacks 220 and 221) responsive to the signals from the rotary route switch 802. For example, the following actions using knob 110 will provide the following responses:

You press knob 110 once to answer a call.

You press and hold knob 110 for "Siri" or Google voice command.

Turn knob 110 left (counterclockwise) for track down.

Turn knob 110 left (counterclockwise) and hold for volume down.

Turn knob 110 right (clockwise) for track up.

Turn knob 110 right (clockwise) and hold for volume up.

In various other embodiments, the results may be paired to various other actions, within the constraint that the controller has a single knob 110.

We claim:

1. A single knob controller comprising:
   a. a knob capable of axial bi-directional translations and bi-directional rotation;
   b. an actuator coupled to said knob; and
   c. a circuit comprising said actuator responsive to said bi-directional axial translation, said bi-directional rotations, and to combinations of a translational state of said bi-directional axial translations and one said rotational state of said bi-directional rotations to produce one of fourteen distinct results,
wherein the system uses at least four results of said fourteen results, said four results comprising:
changing a selected track of an audio compilation source downward;
changing the volume of an audio output to a higher level;
answering a phone call from a telephonic audio input device; and
activating a voice command system.

2. The single knob controller of claim 1, wherein the system uses at least two additional results of said fourteen results, said two additional results comprising:
changing a selected track of an audio compilation source upward; and
changing the volume of an audio output to a lower level.

3. The single knob controller of claim 1, wherein said circuit comprises a low drop out regulator, logic circuitry, an input jack and an output jack.

4. The single knob controller of claim 1, wherein said circuit is at least partially a printed circuit on an elongated circuit board and further comprising a threaded electronics housing enclosing said elongated printed circuit board.

5. The single knob controller of claim 4, wherein said circuit board comprises at least a power input, an audio input, and an audio output.

6. The single knob controller of claim 4, comprising an annular support flange non-rotationally fixed to said threaded electronics housing at an end proximal said knob.

7. The single knob controller of claim 6, comprising a nut threaded onto said threaded electronics housing from an end distal from said knob.

8. The single knob controller of claim 7, wherein said nut can be tightened to create compression of an object between said nut and said annular support flange.

9. The single knob controller of claim 8, wherein said object to be compressed is a panel for mounting said single knob controller.

10. The single knob controller of claim 8, wherein said object to be compressed is a translucent housing comprising at least one illumination source connected to said circuit and responsive to a state of said circuit.

11. The single knob controller of claim 10, wherein said translucent housing comprises at least two fastener receivers and encloses a portion of said threaded electronics housing.

12. The single knob controller of claim 1, wherein said knob is rotationally biased to a first position, from which clockwise rotation and counter-clockwise rotation may be manually accomplished.

13. The single knob controller of claim 1, wherein said knob is translationally biased to extend away from said actuator.

14. A single knob controller comprising:
a. a knob capable of bi-directional axial translations and bi-directional rotations;
b. an actuator coupled to said knob;
c. a circuit comprising said actuator and responsive to a translational state of said bi-directional axial translation, a rotational state of said bi-directional rotation, and to combinations of said one translation of said bi-directional axial translation and one said rotation of said bi-directional rotations to produce one of fourteen distinct results; and
d. wherein said circuit is at least partially a printed circuit on an elongated circuit board and further comprising a threaded electronics housing enclosing said elongated printed circuit board.

15. The single knob controller of claim 14 comprising:
a. an annular support flange non-rotationally fixed to said threaded electronics housing at an end proximal said knob;
b. a nut threaded onto said threaded electronics housing from an end distal from said knob; and
c. wherein said nut can be tightened to create compression of an object between said nut and said annular support flange.

16. The single knob controller of claim 15, wherein:
a. said object to be compressed is a translucent housing comprising at least one illumination source connected to said circuit, said illumination source responsive to a state of said circuit; and
b. said translucent housing comprises at least two fastener receivers and encloses a portion of said threaded electronics housing.

17. The single knob controller of claim 15, wherein said knob comprises:
a. a rotational bias to a first position, from which clockwise rotation and counter-clockwise rotation may be manually accomplished; and
b. a translational bias to extend away from said actuator.

18. The single knob controller of claim 15, wherein said circuit comprises a low drop out regulator, logic circuitry, an audio input jack and an audio output jack.

19. A single knob controller comprising:
a. a knob capable of bi-directional axial translations and bi-directional rotations;
b. an actuator coupled to said knob;
c. a circuit comprising said actuator and responsive to said bi-directional axial translations, said bi-directional rotations, and to combinations of one said axial translation of said bi-directional axial translations and one said rotation of said bi-directional rotations to produce one of fourteen distinct results;
d. wherein said circuit comprise:
  i. an at least partially printed circuit on an elongated circuit board; and
  ii. a threaded electronics housing enclosing said elongated printed circuit board;
e. an annular support flange non-rotationally fixed to said threaded electronics housing at an end proximal said knob;
f. a nut threaded onto said threaded electronics housing from an end distal from said knob;
g. wherein said nut can be tightened to create compression of an object between said nut and said annular support flange; and
h. wherein:
  i. said object to be compressed is a translucent housing comprising at least one illumination source connected to said circuit and responsive to a state of said circuit; and
  ii. said translucent housing comprises at least two fastener receivers and encloses a portion of said threaded electronics housing.

20. The single knob controller of claim 19, comprising a low drop out regulator, logic circuitry operable to control and audio output responsive to manual operation of said knob, an audio input jack and an audio output jack.

* * * * *